United States Patent [19]

Takano

[11] 4,218,817
[45] Aug. 26, 1980

[54] COMPONENT MOUNTING APPARATUS

[75] Inventor: Hiroji Takano, Yawata, Japan

[73] Assignee: Matsushita Electric Industrial Co., Ltd., Kadoma, Japan

[21] Appl. No.: 940,509

[22] Filed: Sep. 7, 1978

[30] Foreign Application Priority Data

Sep. 19, 1977 [JP] Japan ................................. 52-112805

[51] Int. Cl.$^2$ ............................................. H05K 3/32
[52] U.S. Cl. ........................................ 29/741; 29/715; 338/2
[58] Field of Search .................... 29/566.1, 33 M, 715, 29/566.3, 741 OR, 761, 626; 338/2; 140/105, 106, 93 D; 217/2, 5, 155

[56] References Cited

U.S. PATENT DOCUMENTS

| T958,003 | 5/1977 | Russel et al. ......................... 227/2 X |
| 2,867,810 | 1/1959 | Gagnon . | |
| 3,429,170 | 2/1969 | Romeo ................................ 29/741 |
| 4,064,744 | 12/1977 | Kistler ................................ 73/849 X |

*Primary Examiner*—Carl E. Hall
*Assistant Examiner*—C. J. Arbes
*Attorney, Agent, or Firm*—Wenderoth, Lind & Ponack

[57] ABSTRACT

A component mounting apparatus includes a pushing member for inserting a pair of terminal wires of an electric component into a circuit board and a clinching mechanism operatively provided below the circuit board for bending the terminal wires, extending outwardly from the circuit board, sideways in a direction towards each other for fixedly mounting the electric component on the circuit board. The clinching mechanism includes a pair of arms which come into contact with the terminal wires for bending the same. Each of the arms is provided with a pair of stress detecting elements which detects the stress set up in the arm upon contact between the arm and the terminal wire for detecting whether or not the electric component is properly mounted on the circuit board.

7 Claims, 6 Drawing Figures

COMPONENT MOUNTING APPARATUS

BACKGROUND OF THE INVENTION

The present invention generally relates to a component mounting apparatus and, more particularly, to a detecting device for the component mounting apparatus for detecting whether or not an electric component is, after having been mounted on a circuit board, fixed in position on the circuit board.

As used in describing and claiming the present invention, the term "electric component" is used to refer to an electric or electronic element, such as resistor, capacitor, diode or the like, of a type having at least one pair of terminal wires extending outwards from the body of the electric component.

With reference to FIGS. 1(a) and 1(b) of the accompanying drawings, the mounting of an electric component 2 on a printed circuit board 4 having a plurality of pairs of holes 6a and 6b is carried out by first transferring the electric component to a position immediately above the printed circuit board 4 with a pair of lead wires 8a and 8b aligned with a corresponding pair of the holes 6a and 6b, then pushing the electric component with a pushing member 10 so that the terminal wires 8a and 8b are inserted into the holes 6a and 6b, trimming excess portions of the terminal wires extending outwardly from the printed circuit board 4 in a direction opposite to the mounted electric component, and bending the trimmed terminal wires 8a and 8b sideways, preferably in a direction towards each other.

The bending of the trimmed terminal wires 8a and 8b is effected by a clinching mechanism including a pair of arms 12a and 12b supported by and pivotable about pins 14a and 14b, respectively. The contact between free ends of the terminal wires and slanted surfaces 16a and 16b of the arms 12a and 12b, respectively, holds the electric component 2 between the pushing member 10 and respective arms 12a and 12b, and bends the end portions of the terminal wires. Thereafter, clockwise and counterclockwise rotation of the arms 12a and 12b about the pins 14a and 14b, respectively, causes upper end portions of the associated arms 12a and 12b to bend the free end portions of the terminal wires extending outwardly from the printed circuit board 4, whereby the electric component 2 is fixedly mounted on the circuit board 4 as shown in FIG. 1(b).

During the mounting of the electric component 2 on the circuit board 4 in the manner described above, the component mounting apparatus may fail to mount the electric component fixedly on the circuit board, unless the terminal wires are properly inserted into the holes in the circuit board, or unless the electric component has terminal wires of sufficient length.

Because of such a failure in the operation of the component mounting apparatus, there is provided a detecting device in the component mounting apparatus for detecting whether or not the electric component is properly fixed in position on the circuit board.

Referring again to FIGS. 1(a) and 1(b), the conventional type detecting device of includes an electrical power source such as batteries 18a and 18b and current detecting circuits 20a and 20b. The battery 18a and the current detecting circuit 20a are connected in series between the pushing member 10 and the arm 12a which are made of electrically conductive material whereas the battery 18b and the current detecting circuit 20b are connected in series between the pushing member 10 and the arm 12b. When the electric component 2 has the terminal wires thereof properly inserted into the corresponding holes 6a and 6b and when the terminal wires 8a and 8b are subsequently held in contact with and between the pushing member 10 and the arms 12a and 12b, a first closed electrical circuit is established through the battery 18a, the pushing member 10, the terminal wire 8a, the arm 12a and the current detecting circuit 20a and, at the same time, a second closed electrical circuit is established through the battery 18b, the pushing member 10, the terminal wire 8b, the arm 12b and the current detecting circuit 20b. Upon establishment of the first and second closed electrical circuits, each of the current detecting circuits 20a and 20b produces a signal indicating that the electric component 2 is properly mounted on the circuit board. By the utilization of this electric signal, the component mounting apparatus can proceed to mount the electric component.

On the contrary, when at least one of the terminal wires 8a and 8b is not properly inserted into the corresponding hole, said terminal wire will not electrically connect the pushing member 10 to the arm. Therefore, either the first and second circuit will be open and, therefore, the corresponding current detecting circuit will produce a warning signal which is utilized to interrupt the apparatus to prevent further operation.

For the purpose of ensuring the establishment of the first and second circuits independently from each other, the arms 12a and 12b are electrically insulated from each other. Therefore, the arms 12a and 12b are insulated from the respective pins 14a and 14b and means (not shown) for rotating the arms 12a and 12b. However, there is a disadvantage to this arrangement in that the insulation of arms 12a and 12b not only complicates the structure of the arms 12a and 12b, but also requires a careful maintenance of the arms 12a and 12b and the concurrent use of means for preventing the arms 12a and 12b from collecting dust and metallic particles which may cause deterioration of the insulation.

Furthermore, there is also a disadvantage that in the case where the terminal wires are coated with insulating material for some reason or by the overflow of the insulating material coated around the body of the electric component, the electric connection between the pushing member 10 and the terminal wires not take place and the above described closed circuits cannot be established. Therefore, even if the electric component is properly mounted on the circuit board, the current detecting circuits may produce the warning signal.

Moreover, there is a disadvantage that the electric component itself will be adversely affected by current flowing through any one of the above described closed circuits.

SUMMARY OF THE INVENTION

Accordingly, a primary object of the present invention is to provide a component mounting apparatus provided with a detecting device which reliably detects the failure of the component mounting apparatus to operate properly.

Another object of the present invention is to provide a component mounting apparatus provided with a detecting device of the above described type which is simple in construction and can be readily manufactured.

A further object of the present invention is to provide a component mounting apparatus provided with a detecting device of the above described type which will not allow any current to flow through the electric component.

In accordance with a preferred embodiment of the invention, a component mounting apparatus provided with the detecting device for detecting whether or not the electric component is fixed in position on the circuit board includes clinching means operatively provided below the circuit board for bending the terminal wires extending outwardly from the circuit board in a direction opposite to the mounted electric component. the clinching means has at least one pair of movable arms which come into contact with the terminal wires to bend the latter. Provided on each of the arms is means for detecting stress set up in the arm upon contact between the arm and the terminal wire. The detecting means is connected to circuit means for producing a signal when said detecting means detects the stress set up in the arm.

BRIEF DESCRIPTION OF THE DRAWINGS

These and other objects and features of the present invention will become apparent from the following description taken in conjunction with a preferred embodiment thereof with reference to the accompanying drawings, in which.

DETAILED DESCRIPTION OF THE INVENTION

Figure 1A:
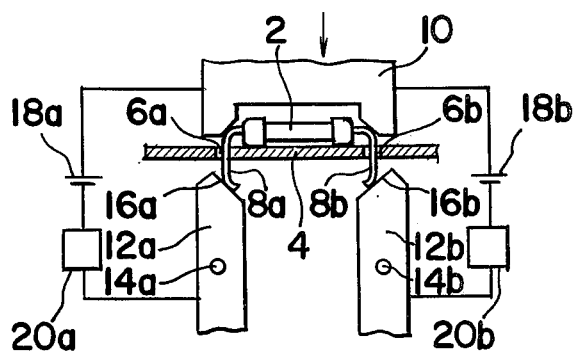
FIGS. 1(a) and 1(b), which have already been referred to in the foregoing description, are respectively a fragmentary schematic view of a component mounting apparatus provided with a prior art detecting device in one operative position ready to bend the terminal wires, and a view similar to FIG. 1(a), but showing the apparatus in another operative position in which the terminal wires have been bent.
Figure 1B:
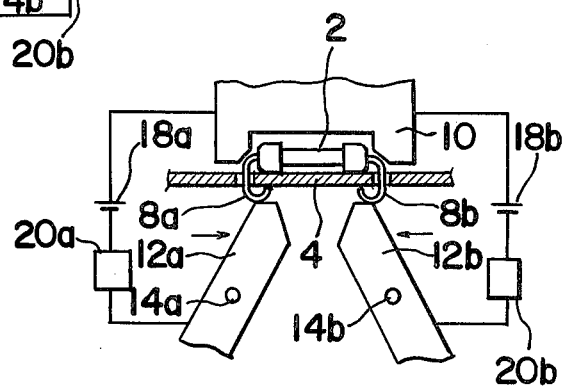

Before the description of the present invention proceeds, it is to be noted that like parts are designated by like reference numerals throughout the accompanying drawings.

Figure 2:
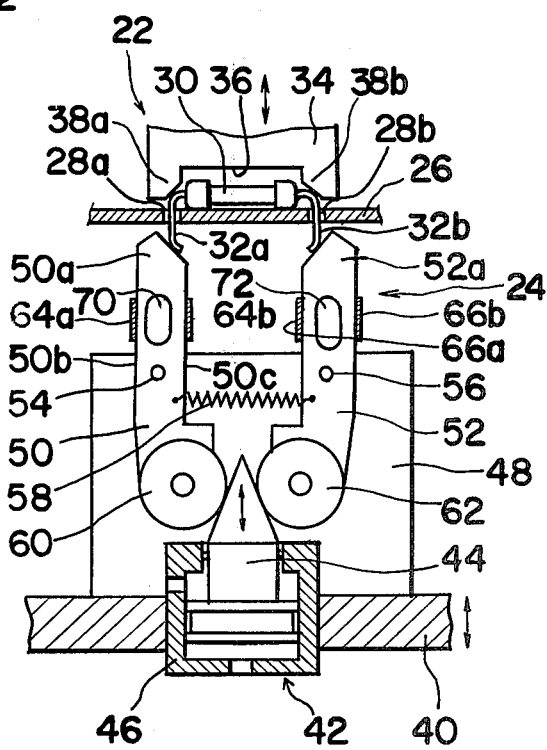
FIG. 2 is a schematic elevational view of a component mounting apparatus provided with a detecting device according to the present invention.

Referring to FIG. 2, there is shown a component mounting apparatus which comprises an inserter head, generaly designated by 22 and including a pushing member 34 supported in any known manner for movement between inoperative and operative positions, and a clinching assembly generally designated by 24, positioned below and in alignment with the inserter head 22 and including a pair of pivotally supported arms 50 and 52. Although not shown, the apparatus further comprises a component feed unit from which electric components are successively supplied one at a time towards a mounting position between the inserter head 22 and the clinching assembly 24, and a circuit board transfer unit from which printed circuit boards 26, each having a plurality of pairs of holes 28a and 28b defined therein, are successively transferred one at a time towards the mounting position where the electric components are successively mounted on any one of the printed circuit boards. The clinching assembly 24 is supported in any known manner, for example, on a deck 40, for movement between raised and lowered positions in synchronism with the movement of the pushing member 34 between the operative and inoperative positions, respectively.

The component mounting apparatus thus far described is well known to those skilled in the art and, therefore, while the details thereof are herein omitted for the sake of brevity, it will be described in terms the operation thereof.

Assuming that the pushing member 34 and the clinching assembly 24 are held in the inoperative and lowered positions, respectively, and that one of the printed circuit boards is transferred towards the mounting position as shown in FIG. 2, one of the electric components 30 is positioned with its terminal wires 32a and 32b inserted in any known manner through the corresponding holes 28a and 28b in the printed circuit board 26 at the mounting position. At this time, the pushing member 34 moves from the inoperative position towards the operative position and, during this movement of the pushing member 34, legs 38a and 38b protruding outwardly in spaced relation to each other from one end of the pushing member 34 adjacent the circuit board 26 cause the respective terminal wires 32a and 32b to pass through the corresponding holes 28a and 28b in the printed circuit board 26 substantially as shown in FIG. 2.

During the movement of the pushing member 34 towards the operative position or upon completion of such movement of the member 34, the clinching assembly 24 is moved from the lowered position towards the raised position as shown and, thereafter, the pivotally supported arms 50 and 52 are respectively pivoted in a manner which will be described later in clockwise and counterclockwise directions about support pins 54 and 56 to bend the free end portions of the terminal wires 32a and 32b, which extend outwards from the printed circuit board 26 in a direction away from the body of the electric component on the circuit board 26, sideways, that is, in a direction towards each other. With the free end portions of the lead wires 32a and 32b thus bent, the electric component 30 is fixed on the printed circuit board 26.

For operating the pivotally supported arms 50 and 52 in the manner as hereinabove described, the clinching assembly 24 further includes a piston-cylinder device 42 and each of the arms 50 and 52 is shaped as will now be described.

The piston-cylinder device 42 is rigidly mounted on the deck 40 and includes a piston 44 having one end tapered and the other end operatively accommodated within a cylinder 46 rigidly connected to the deck 40. Also mounted on the deck 40 is a supporting plate 48 extending perpendicular from the deck 40. The arms 50 and 52 are pivotally connected at a substantially intermediate portion thereof to the supporting plate 48 by means of the support pins 54 and 56, respectively. These pivotable arms 50 and 52 are pivotable simultaneously in a manner as described later between a closed position, in which upper end portions 50a and 52a of the arms 50 and 52 are moved towards each other, and an opened position in which the upper end portions 50a and 52a are moved away from each other. The arms 50 and 52 are normally held in the opened position by an urging spring 58 extending between lower end portions of the respective arms 50 and 52.

A pair of rollers 60 and 62 are rotatably mounted on the lower ends of the arms 50 and 52, respectively, while the tapered end of the piston 44 is engaged between these rollers 60 and 62. With this construction, when the piston-cylinder device 42 is actuated so as to project the piston 44 outwardly from the cylinder 46, the tapered end of the piston 44 engaged between the rollers 60 and 62 causes the rollers 60 and 62 to move away from each other against the urging spring 58 with the arms 50 and 52 consequently pivoting from the opened position towards the closed position.

Upon movement of the arms 50 and 52 from the opened position, the upper end portions 50a and 52a of the respective arms 50 and 52 come into contact with the adjacent terminal wires 32a and 32b and, as the arms 50 and 52 move further towards the closed position, they push the wires in a direction towards each other. Upon completion of the movement of the arms 50 and 52 to the closed position as shown, the terminal wires 32a and 32b are bent in a direction towards each other with the electric component consequently firmly fixed on the printed circuit board 26.

The detecting device for detecting whether or not the electric component 30 is fixed in position on the circuit board 26 comprises at least one pair of stress detecting elements. In the illustrated embodiment, the detecting device is shown to comprise two pairs of stress detecting elements, the stress detecting elements 64a and 64b of one pair being provided on the arm 50 and the stress detecting elements 66a and 66b of the other pair being provided on the arm 52.

It is to be noted that, since the detecting elements of these pairs have the same construction while the arms 50 and 52 have the same construction, only one pair of the detecting elements, for example, the detecting elements 64a and 64b, will now be described as to their position and arrangement relative to the associated arm 50. The detecting elements 64a and 64b are bonded respectively to the opposed, outside and inside surfaces 50b and 50c of the arm 50 and are aligned in position with each other on respective sides of the arm 50. Each of the detecting elements 64a and 64b has an intrinsic resistance which changes upon deformation of the element. For example, each detecting element 64a or 64b has an intrinsic resistance which tends to decrease and increase respectively when the element expands and contracts.

Figure 3:
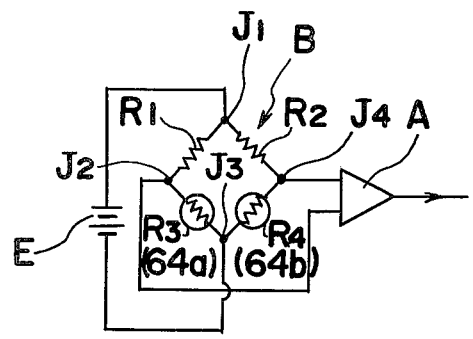
FIG. 3 is a circuit diagram showing the detecting device of the present invention.

The detecting elements 64a, and 64b and 66a and 66b of the pairs arranged as hereinabove described are electrically connected to respective means for detecting change in resistance of the detecting elements, for example, bridge circuits B having the same construction as shown in FIG. 3.

Referring now to FIGS. 3 wherein only one of the bridge circuits associated with the detecting elements 64a and 64b is shown, the bridge circuit B comprises resistors R1, R2, R3 and R4 which are connected in a four-terminal electrical network having four terminal junctions J1, J2, J3, J4. In this network, the resistor R1 is connected between the junctions J1 and J2, the the resistor R3 is connected between the junctions J2 and J3, the resistor R4 is connected between the junctions J3 and J4, and the resistor R2 is connected between the junctions J4 and J1. A power source, such as battery E is connected between the junctions J1 and J3 for impressing a potential therebetween, and a differential amplifier A has two input terminals connected respectively to the junctions J2 and J4 for detecting the voltage developed between these junctions J2 and J4. It is to be noted that the resistors R3 and R4 are constituted by the detecting elements 64a and 64b respectively. The operation of the circuit B associated with the detecting elements 64a and 64b will now be described. However, it should be noted that the description concerning the operation of the circuit B associated with the detecting elements 64a and 64b can equally apply to that associated with the detecting elements 66a and 66b.

When and so long as the arms 50 and 52 are held in the opened position and the arm 50 has not therefore contacted the associated terminal wire 32a, the detecting elements 64a and 64b are in a normal state and have a predetermined value of resistance. On the other hand, the resistors R1 and R2 are so selected as to balance the bridge circuit B to produce no voltage difference between the junctions J2 and J3 when the detecting elements 64a and 64b are in the normal state. When the arm 50 comes into contact with the terminal wire 32a as the arms 50 and 52 are brought to the closed position, a stress is produced in the arm 50 by the force of arm 50 pushing against the terminal wire 32a. Accordingly, the detecting element 64b bonded to the inside surface 50c of the arm 50 expands and the detecting element 64a bonded to the outside surface 50b contracts and, therefore, the resistances of the respective detecting elements 64a and 64b vary. In terms of the circuit, this means that the resistances of the respective resistors R3 and R4 vary in opposite relation to each other, which in turn results in development of a voltage difference between the junctions J2 and J4. Such voltage difference is detected by the differential amplifier A which subsequently produces the differential signal which indicates that the arm 50 has come into contact with the terminal wire 32a to properly fix the electric component 30 on the circuit board 26.

For the purpose of improving the sensitivity of each of the pairs of the detecting elements 64a and 64b or 66a and 66b, there is formed an opening 70 or 72 in the arm 50 or 52 at a position substantially between the detecting elements 64a and 64b or 66a and 66b for forming a thin-gauged portion in the arm 50 or 52 and thus increasing the flexibility of the arm 50. Where only one of the pairs of the detecting elements, for example, the detecting elements 64a and 64b, are employed, the arm 52 need not have the opening 72.

The signal produced from the differential amplifier A is utilized as a triggering signal necessary to allow the component mounting apparatus to proceed further in the operation thereof.

If said signal is not produced from the differential amplifier within a predetermined period of time, it is understood that the terminal wires are not properly inserted into the holes in the circuit board, or that the terminal wire on the electric component is not long enough. In other words, when no signal is produced from the differential amplifier within a predetermined period of time it indicates that the electric component is not properly positioned on the circuit board.

It is to be noted that the detecting elements 64a, 64b or 66a, 66b of each pair which have been described as having their resistances decreasing and increasing respectively upon expansion and contraction, may be so designed as to have their resistances increasing and decreasing respectively upon expansion and contraction.

As is fully described above, the detecting device employed in the component mounting apparatus according to the present invention does not require any electrical current to flow through the electric component for effecting the detection. Therefore, there is no need to provide any insulating means on the arms 50 and 52 or to maintain or ensure the electrical connection between the arms 50 and 52 the terminal wires 32a and 32b. Thus the detecting device according to the present invention is operable with the electric components having the terminal wires coated with an electrically insulating material. Furthermore, since the detection is carried out without any electrical contact, the detecting device can operate for a long period of time in a stable condition without any particular maintenance.

Figure 4A:
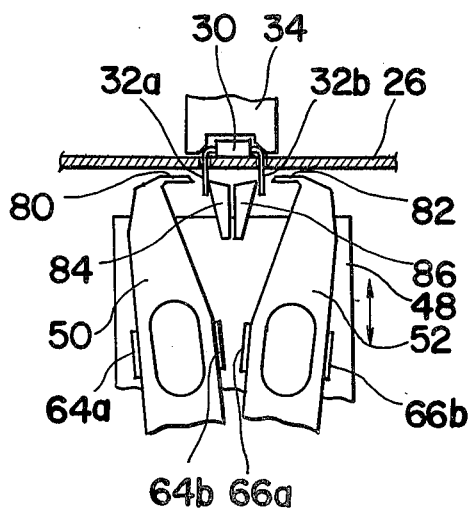
FIG. 4(a) is a schematic elevational view of a portion of the component mounting apparatus according to another embodiment of the present invention, the apparatus being shown in one operative position ready to trim and bend the terminal wires.
Figure 4B:
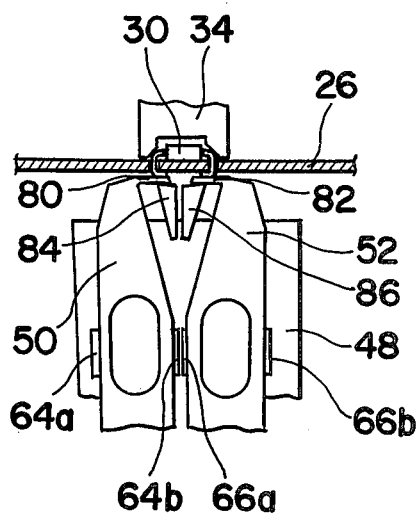
FIG. 4(b) is a view similar to FIG. 4(a), but showing the apparatus in another operative position in which the terminal wires have been bent.

Referring to FIGS. 4(a) and 4(b), there is shown another embodiment of the component mounting apparatus provided with the detecting device of the above described type in which the clinching assembly is operatively positioned immediately below and in alignment with the pushing member 34 having the construction as hereinbefore fully described with the circuit board 26 situated between the pushing member 34 and the clinching assembly. FIG. 4(a) illustrates the condition prior to the component being mounted on the printed circuit board 26, wherein the pair of arms 50 and 52 are held in the opened position. Provided at and protruding from the upper end portions of the respective arms 50 and 52 are movable cutters 80 and 82 cooperating with a pair of adjustable fixed cutters 84 and 86 provided on the supporting plate 48 immediately below the printed circuit board 26 so that the terminal wires 32a and 32b extend through a gap between the cutters 80 and 84 and a gap between the cutters 82 and 86, respectively. When the arms 50 and 52 are moved to the closed position, the excess portion of the terminal wires extending below the fixed cutters 84 and 86 are trimmed by the engagement of the movable cutters 80 and 82 with the fixed cutters 84 and 86, respectively.

FIG. 4(b) illustrates the arms 50 and 52 held in the closed position in which the movable cutters 80 and 82 bend the trimmed terminal wires to fix the electric component on the circuit board 26. Since the arms 50 and 52 exert a greater force when the terminal wires are being trimmed than when the terminal wires are bent, a greater amount of stresses are set up in the arms 50 and 52 than in the foregoing embodiment. Therefore, the change in resistance of the detecting elements 64a, 64b, 66a and 66b in the embodiment of FIGS. 4(a) and 4(b) is greater than that in the foregoing embodiment.

Although the present invention has been fully described by way of examples with reference to the accompanying drawings, it is to be noted that various changes and modifications will be apparent to those skilled in the art. Therefore, unless such changes and modifications depart from the true scope of the present invention, they should be construed as being included therein.

I claim:

1. An apparatus for mounting electric components, each having a body portion and a plurality of terminal wires extending from said body portion, on a side of a circuit board comprising:
   clinching means operatively provided below the circuit board for bending the terminal wires extending outwardly from the circuit board on the side thereof opposite to the side on which the electric component is mounted, said clinching means having at least one pair of movable arms which come into contact with the terminal wires;
   means on said clinching means for detecting stress set up in each of the arms upon contact between the arm and the terminal wire; and
   circuit means connected to the detecting means for producing a signal when said detecting means detects the stress set up in the arm.

2. An apparatus as claimed in claim 1, wherein each of the arms includes means for trimming excess portions of the terminal wires.

3. An apparatus as claimed in claim 1, wherein said detecting means is a resistance element bonded on a side surface of the arm, said resistance element having a property which causes it to undergo change in resistance upon expansion and contraction thereof, whereby the bending of the arm effected by the stress causes resistance change in the resistance element.

4. An apparatus as claimed in claim 3, wherein said circuit means is a bridge circuit for detecting resistance change in the resistance element.

5. An apparatus as claimed in claim 1, wherein each of said arms has an opening therein for forming a thin-gauge portion where the stress which is set up is most intense.

6. An apparatus for mounting electric components, each having a body portion and a plurality of terminal wires extending from the body portion, on a side of a circuit board comprising:
   a clinching means operatively provided below the circuit board for bending the terminal wires extending outwardly from the circuit board on the side thereof opposite to the side on which the electric component is mounted, said clinching means having at least one pair of movable arms which come into contact with and push the terminal wires sideways in a direction parallel to the printed circuit board;
   at least one pair of resistance elements bonded to the opposite side surfaces of one of said arms, the respective resistances of said resistance elements being capable of changing upon expansion and contraction of said resistance elements in opposite relation to each other, said expansion and contraction of said resistance elements taking place when the terminal wires are pushed by the arms;
   a four-terminal electrical network having first, second, third and fourth terminals and including a first resistor across the first and second terminals, a second resistor across the first and fourth terminals, a third resistor across the second and third terminals, and a fourth resistor across the third and fourth terminals, said first and second resistors having resistance values to provide the same voltage level at the second and fourth terminals when the third and fourth resistor are free from expansion and contraction and when a potential is impressed across the first and third terminals, said thrird and fourth resistors being respectively constituted by said resistance elements of the pair;
   means connected to said first and third terminals for detecting the voltage developed across the second and fourth terminals.

7. An apparatus as claimed in claim 6, further comprising a further pair of resistance elements bonded to the opposite side surfaces of the other of the arms, said further resistance elements being identical in construction and performance with those of said one pair, and further comprising a further four-terminal electrical network having a similar construction to that of said firstmentioned four-terminal electrical network, the third and fourth resistors in said further four-terminal electrical network being respectively constituted by the resistance elements of said further pair.

* * * * *